United States Patent [19]

Schneider

[11] Patent Number: 5,331,273
[45] Date of Patent: Jul. 19, 1994

[54] THERMAL FIXTURE FOR TESTING AN INTEGRATED CIRCUIT

[75] Inventor: Walter T. Schneider, Portsmouth, R.I.

[73] Assignee: The United States of America as represented by the Secretary of the Navy, Washington, D.C.

[21] Appl. No.: 866,920

[22] Filed: Apr. 10, 1992

[51] Int. Cl.⁵ .................... G01R 31/02; H01L 23/44
[52] U.S. Cl. .................... 324/158.1; 165/80.4
[58] Field of Search .............. 324/158 P, 158 F, 72.5; 361/385; 165/80.4

[56] References Cited

U.S. PATENT DOCUMENTS

| | | | |
|---|---|---|---|
| 3,710,251 | 1/1973 | Hagge et al. | 324/158 P |
| 4,791,364 | 12/1988 | Kufis et al. | 324/158 P |
| 4,839,587 | 6/1989 | Flatley et al. | 324/158 P |
| 5,001,423 | 3/1991 | Abrami et al. | 324/158 F |
| 5,034,688 | 7/1991 | Moulene et al. | 361/385 |
| 5,084,671 | 1/1992 | Miyata et al. | 324/158 F |
| 5,097,207 | 3/1992 | Blanz | 324/158 F |

Primary Examiner—Ernest F. Karlsen
Attorney, Agent, or Firm—Michael J. McGowan; Prithvi C. Lall; Michael F. Oglo

[57] ABSTRACT

Apparatus for controlling the temperature of an integrated circuit. A thermally conductive block has a vacuum passage connected to a vacuum pump for clamping the block to the top of an integrated circuit housing without mechanical clamping structures. A closed fluid loop including a circulating pump, heater and chiller modulate the temperature of a fluid passing through the conductive block thereby to control its temperature and the temperature of the integrated circuit independently of any other integrated circuit.

18 Claims, 2 Drawing Sheets

THERMAL FIXTURE FOR TESTING AN INTEGRATED CIRCUIT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention generally relates to an apparatus for testing integrated circuits and more specifically to an apparatus for controlling the temperature of an integrated circuit under test.

(2) Description of the Prior Art

It is well known that the performance of an integrated circuit varies with the temperature of that integrated circuit. Consequently, integrated circuit specifications typically define a range of operating temperatures, such as from −55° C. to +125° C. As the temperature of an integrated circuit deviates from a nominal, normally room temperature, significant performance variations may occur if an integrated circuit is faulty. In some cases, the integrated circuit may even stop working when it is in a particular temperature range and thereafter may or may not return to its normal operation when the temperature returns to its nominal range.

As integrated circuits have become more complex and costly, there has been a heightened interest in testing them under widely varying temperature conditions. Such testing helps in acquiring an understanding of temperature effects both on the performance of the integrated circuit individually and on the performance of electronic assemblies incorporating a particular integrated circuit together with other integrated circuits. Moreover, such testing, as part of a quality control program, can improve electronic circuit assembly and manufacturing processes.

In recent years manufacturers have adopted rigorous quality control procedures during the initial manufacture of an integrated circuit on a wafer and at all subsequent intermediate assembly steps whereby that integrated circuit is included in a completed electronic assembly. Thermal testing at a wafer stage involves testing individual circuits or "dies" to determine whether the dies perform properly at specified high and low temperature limits.

U.S. Pat. No. 4,791,364 issued Dec. 13, 1988 to Kufis et al for a Thermal Fixture for Testing Integrated Circuits discloses such apparatus. Specifically, an indexing table positions a wafer with a number of individual dies in proximity to a testing probe. The probe includes a structure for directing, in a localized manner, a high-temperature, low-temperature or ambient-temperature gas, such as nitrogen, to an individual die. Gas can be used for temperature adjustment because it is only necessary to heat or cool the wafer surface in order to change the temperature of a die. The apparatus initially directs cold gas to a die under test and monitors performance after the temperature stabilizes. Next the apparatus directs hot gas to the die and monitors performance after the temperature stabilizes. Testing stops if either test indicates improper performance. If a die passes both the high and low temperature tests, gas at an ambient temperature is directed to the area merely for purposes of cooling the die.

Integrated circuit manufacturers combine various dies into integrated circuits encased in a ceramic or other housing with a plurality of terminal pins for assembly with other integrated circuits on a printed circuit board. Testing continues during the assembly process. However, apparatus such as disclosed in the Kufis et al patent is not effective because the housings on integrated circuits tend to insulate the dies. Quality control procedures involving thermal testing also become more complex when assembled printed circuit boards are under test. Particularly, a circuit board under extreme thermal conditions can fail intermittently and produce seemingly unrelated changes in system performance thereby complicating circuit diagnoses and repair. In one prior art approach an entire circuit board to be is located in an environmental chamber. The chamber controls the temperature of the circuit board and all the components. It is not possible to alter the temperature of a single integrated circuit independently in such a chamber. Yet it can be difficult to determine which individual integrated circuit produces erratic results without the capability of altering the temperature on a single integrated circuit. In some situations circuit timing signals may prevent testing of even a single circuit board in an environmental chamber remotely from other printed circuit boards.

Heat guns and cooling liquids, such as Freon, are also used to direct temperature controlling substances toward an individual integrated circuit. Although this localizes the temperature change to an area surrounding a particular integrated circuit, it is difficult to stabilize the temperature of an individual integrated circuit for any significant interval. The results therefore tend to be qualitative rather than quantitative. Cooling liquids also can produce condensation on the printed circuit board and integrated circuit. Such condensation can cause circuits on a printed circuit board to malfunction.

Other apparatus uses a cooling unit that connects directly clamps to an integrated circuit using a mechanical clamping mechanism. No analogous structures have been suggested for heating. These cooling units are cumbersome to use, and the time required to clamp and unclamp an individual cooling unit from an integrated circuit can dramatically extend the time required to test a circuit board.

SUMMARY OF THE INVENTION

Therefore it is an object of this invention to provide apparatus for thermally testing integrated circuits.

Another object of this invention is to provide apparatus for controlling the temperature of an individual integrated circuit on a printed circuit board.

Yet another object of this invention is to provide apparatus for controlling the temperature of an individual integrated circuit independently of other integrated circuits on a printed circuit board.

Still another object of this invention is to provide apparatus for controlling the temperature of an integrated circuit without a requirement for cumbersome mechanical clamping mechanisms.

In accordance with one aspect of this invention, apparatus for controlling the temperature of an individual integrated circuit includes a thermally conductive block for abutting the integrated circuit housing. The conductive block contains a passage in a closed liquid circulation loop including a pump and a temperature controller. A temperature sensor located at the conductive block and the temperature controller establish a temperature for fluid in the loop thereby to control the temperature of the block and the abutting integrated circuit by conduction.

In accordance with another aspect of this invention the testing apparatus includes a conductive block with a plurality of passageways. One passageway terminates at a-surface that abuts the housing and connects to a vacuum system for vacuum clamping the conductive block to the integrated circuit. A closed-loop circulates a fluid through another passageway. A temperature controller establish the temperature of the fluid, hence the conductive block and the attached integrated circuit.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF THE PREFERRED EMBODIMENT

Figure 1:
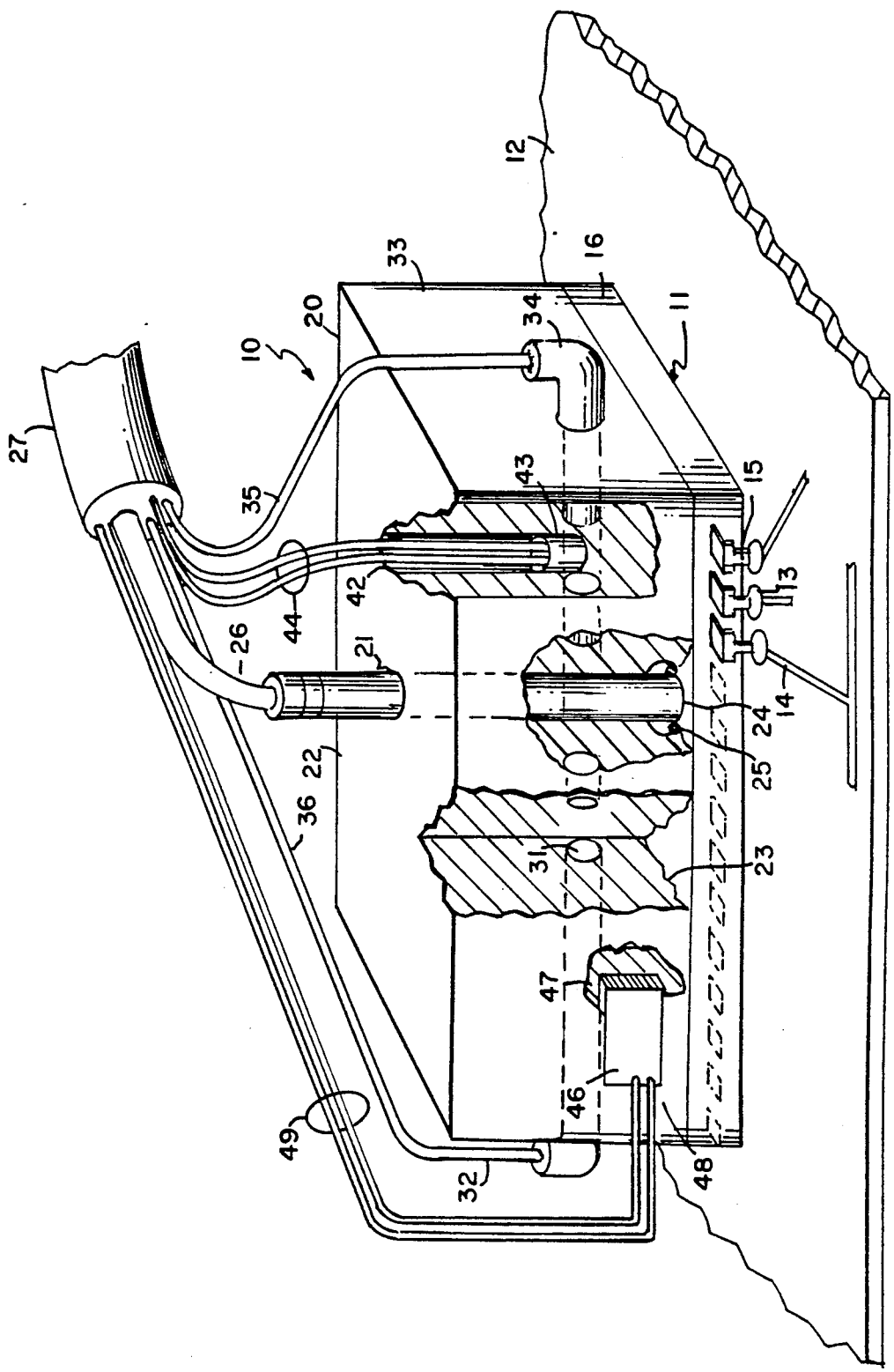
FIG. 1 is a perspective view of a portion of testing apparatus constructed in accordance with this invention as it attaches to an integrated circuit under test.
Figure 2:
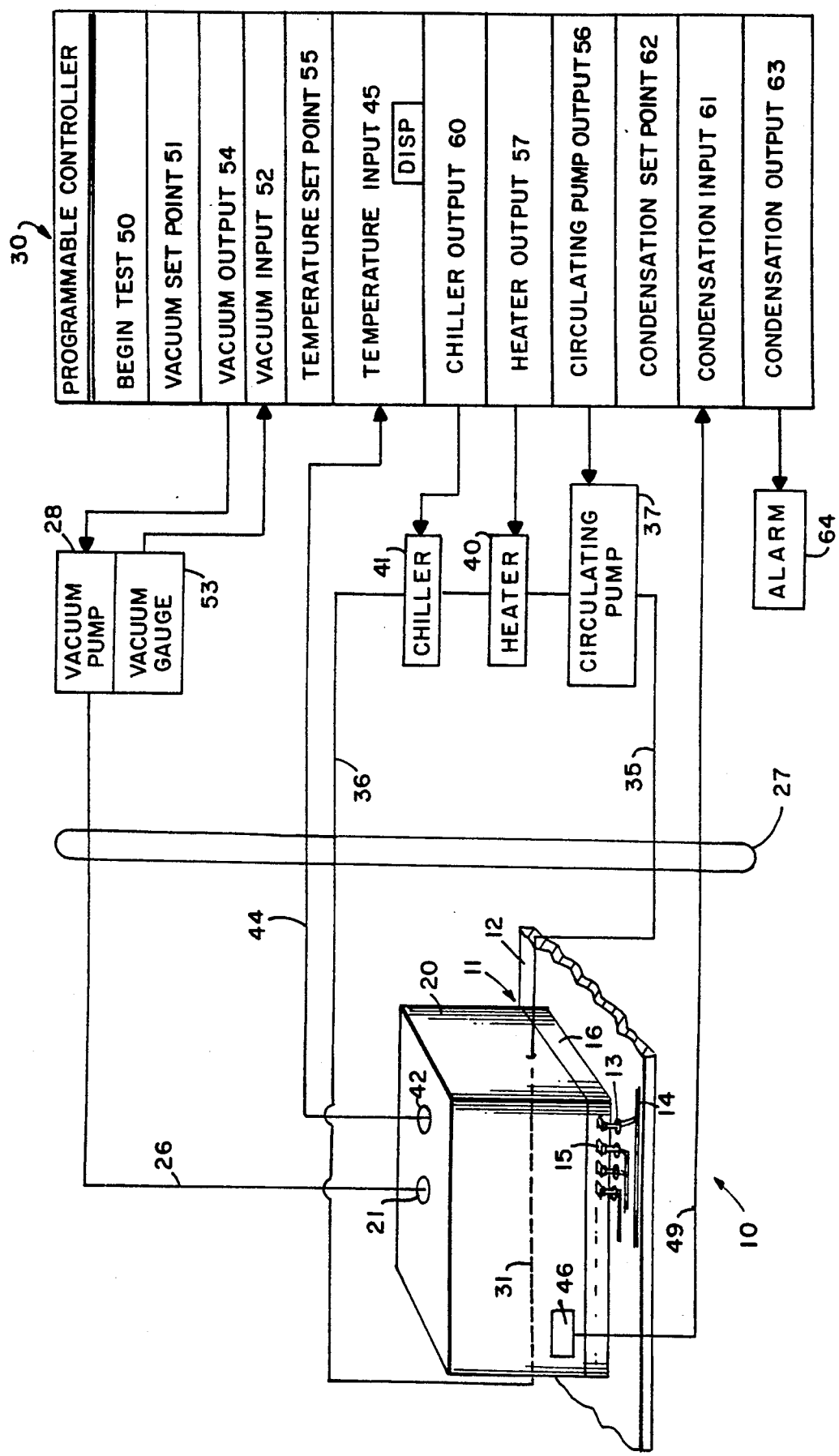
FIG. 2 depicts the testing apparatus of FIG. 1 and its interrelationship with a control system in schematic form for the testing apparatus.

FIGS. 1 and 2 disclose testing apparatus 10 for controlling the temperature of an individual integrated circuit 11 during a testing procedure. The integrated circuit 11 may be located on a circuit board 12 as shown or independently of a circuit board in an electrical test fixture. Referring specifically to FIG. 1, the printed circuit board 12 includes a plurality of terminal eyes 13 and conductor runs 14. The integrated circuit 11 comprises terminal pins 15 that extend through the terminal eyes 13 and are soldered to the printed circuit board 12. An integrated circuit housing 16 normally comprises a ceramic or other insulating material that supports the internal structure and includes a top surface that constitutes an accessible planar surface having a predetermined shape. A typical integrated circuit top surface is formed as a rectangle.

The testing apparatus 10 includes a thermally conducting block 20 composed of any of a wide range of heat-conductive materials. Aluminum and copper constitute two such materials. The block 20 is sized to correspond to the housing 16. For example, if an integrated circuit has the form of a dual-in-line package (a "DIP" circuit), the block may have dimensions of 0.3"(w)×0.7"(l)×0.5"(h) thereby to correspond to a dual-in-line package of about 0.7" in length. A longer block might be used for a range of lengths and even for different circuit housings so long as the block overlies the integrated circuit under test and does not interfere with other circuit components. Particularly, the block should be appropriately spaced from other components in the printed circuit board for thermal isolation. As will become apparent, the size of the block and even its configuration will vary to accommodate the particular integrated circuit or circuits under test.

The conductive block 10 includes a plurality of passageways including a vacuum passageway 21 that extends from a top surface 22 to a bottom surface 23 of the conductive block 20. The bottom surface 23 contacts the top of the integrated circuit housing 16 and forms a heat conductive path with the housing 16. The surface, as shown, will engage at least a portion of the accessible planar surface of the housing 16. An annular channel 24 formed in the bottom surface 23 proximate the exit point carries a conventional O-ring seal 25. A vacuum hose 26 attaches to the vacuum passageway 21 at the top surface 22 by means of conventional vacuum fittings. An umbilical cable 27 carries hose 26 to the pumping port of a vacuum pump 28 associated with a control system 30 as shown in FIG. 2.

A second passageway 31 extends horizontally through the block 20, is offset from the vacuum passageway 21 and exits the block 20 at a left side 32 and a right side 33 in the orientation shown in FIG. 1. Conventional hose fittings, as for example the hose fittings 34 represented at the right wall 33, connect the ends of the passage 31 to hoses 35 and 36. The passage 31 and the hoses 35 and 36, from the umbilical cord 27, form part of a closed-loop fluid circulation system including a circulating pump 37, a heater 40 and a chiller 41 as shown in FIG. 2.

The thermally conductive block 20 additionally includes a thermocouple well 42 offset from both the vacuum passageway 21 and the fluid passageway 31. In this particular embodiment the thermocouple well 42 is formed vertically from the top surface 22 of the block 20. A thermocouple 43 at the bottom of the well 42 produces electrical signals representing the temperature of the block 20 on thermocouple leads 44. A temperature input module and display 45 shown in FIG. 2 connected to the leads 44 to respond to input signals from the thermocouple 43.

When the temperature of the block 20 and the integrated circuit 11 drop below the ambient temperature, water vapor can condense. If condensation can be detrimental to the operation of the printed circuit board or the validity of a test, the conductive block 20 may also include a conventional condensation monitor 46 normally mounted in a surface well 47 recessed in a surface of the conductive block 20, such as a front surface 48. The umbilical cable 27 carries condensation monitor leads 49 to the control system 30.

Referring primarily to FIG. 2, the control system 30 may take any of many forms. A conventional programmable controller, for example, contains an internal control unit for controlling the operation of various functional output modules in response to signals and input modules according to some logical sequence. Such a control system would include a start or "BEGIN TEST", module 50 for initializing the control system 30 and beginning the logical test sequence.

A vacuum section of the programmable controller 30 includes a vacuum set point module 51 for establishing a vacuum set point and a vacuum input module 52 for receiving vacuum readings from a vacuum gauge 53 associated with the vacuum pump 28. Either or both of the vacuum input module 52 and the vacuum gauge 53 may include a visual digital or analog display. A vacuum output module 54 compares a reading from the vacuum set point module 51 and the vacuum input module 52 to control the vacuum pump 28.

In use, an operator will position the conductive block 20 on the housing 16 of the integrated circuit 11. Then the operator will initiate a test sequence by activating the "BEGIN TEST" module 50. The relative readings from the vacuum set point module 51, vacuum gauge 53 and vacuum input module 52 will cause the vacuum output module 54 to energize the vacuum pump 28 and begin a pump-down sequence. For most applications, the vacuum produced by a single stage vacuum pump will provide an adequate force to hold the block 20 against the housing 16 thereby to form a good heat conductive path between the housing 16 and the block 20.

The vacuum passageway 21 thereby constitutes a vacuum port terminating at the integrated circuit housing 16 at one end and being coupled, at the other end, to a vacuum means including the pump 28. Drawing a vacuum in the tube 26 clamps the bottom surface 23 of the thermally conductive block 20 to the top of the integrated circuit housing 16. The O-ring seal 25 assures an integral vacuum structure. In a preferred embodiment the vacuum port 21 is located at the mid point of the block 20.

As previously stated, the circulating pump 37, heater 40 and chiller 41 control the temperature of the integrated circuit 11. Specifically, the temperature input module 45 receives the output signal from the thermocouple 43 in the thermocouple well 42 and may display the temperature in analog or digital form. The operator establishes a desired temperature by adjusting a temperature set point module 55. A circulating pump output module 56 controls the circulating pump 37 and may also be interlocked so the circulating pump output module 56 does not energize the circulating pump 37 until the vacuum input module 52 indicates an acceptable vacuum level. During circulation, signals from the temperature set point module 55 and the temperature input module 45 control a heater output module 57 and a chiller output module 60 to modulate the temperature of any fluid carried from the chiller 41 through the hose 36 and back to the circulating pump 37 through a hose 35 from the passageway 31. Specifically the control system 30 raises or lowers the temperature of any fluid, such as water or a glycol solution, pumped through the block 20 to a temperature established by the temperature set point module 55. An operator changes temperature merely by readjusting a control of the temperature set point module 55.

The heater 40 and chiller 41 operate in response to signals from the control system 30 for controlling the temperature of liquid or other fluid in the closed circulating loop. As the liquid travels through the passage 31, the thermally conductive block 20 assumes the same temperature. Thus, this closed loop system defines a fluid deliver means for circulating a fluid through the passageway and for controlling the temperature of that fluid, the conductive block 20 and the integrated circuit 11.

As previously indicated, the umbilical cord 27 carries condensation monitor leads 49 to a condensation input module 61. A condensation set point module 62 establishes maximum condensation level. Whenever the input signal from the condensation input module 61 exceeds permitted level established by the set point module 62, a condensation output module 63 can energize an alarm circuit 64 to produce an audio or visual alarm. The control system 30 also may utilize this output as an interlock to cause the control system 30 either to de-energize the chiller 41 or to take some other appropriate action.

As will now be apparent, testing apparatus constructed in accordance with this invention controls the temperature of a single individual integrated circuit independently of other integrated circuits or components on a printed circuit board. The apparatus is simple to construct and to operate. An operator merely positions the conductive block 20 on the integrated circuit housing 16 and initiates a control sequence through a start module 50. The sequence may be as simple as turning on a switch on a control panel. A vacuum system generates a vacuum that clamps the conductive block 20 to the housing 16 without any other mechanical clamps or structures. The operator establishes an operating temperature merely by adjusting an input device, such as a potentiometer or equivalent structure that forms a part of a temperature set point module 55. The control system 30 uses the heater 40 and chiller 41 to modulate the temperature of fluid in the passage 31 to bring the conductive block 20 and the integrated circuit 11 to the appropriate temperature.

Thus, it is possible to test and quantify the performance of a circuit in response to the temperature of any particular integrated circuit in the circuit and to test this response independently for each integrated circuit over a wide range of temperatures that, in part, depends upon the liquid selected for use in the closed fluid circulating loop. It is also possible to utilize plural apparatus as shown in FIGS. 1 and 2 to operate different integrated circuits on a circuit board or in an electronic subassembly or assembly at different temperatures and to control the temperatures of each integrated circuit independently of the others. This provides great flexibility in analyzing circuit operations and in detecting causes of failures or erratic operation.

This invention has been disclosed in terms of a specific embodiment. It will be apparent that many variations can be adapted to this structure while obtaining some or all of the advantages of the invention. For example, the configuration of the specifically disclosed passageways in FIGS. 1 and 2 can be altered for other integrated circuits or components for testing. The control system 30 is disclosed as a simple, conventional programmable controller circuit as is well known in the art. The specific implementation of such a control system by using other modules and other operating sequences is possible. Many other modifications can be made to the disclosed apparatus without departing from the invention. Therefore, it is the intent of the appended claims to cover all such variations and modifications as come within the true spirit and scope of this invention.

What is claimed is:

1. In apparatus for testing the operation of an assembled electronic circuit board having a plurality of electrically interconnected, physically spaced, integrated circuits with housings and other components mounted thereon, each housing having at least one accessible planar surface having a predetermined shape, the improvement of temperature control apparatus for varying the temperature of an individual integrated circuit independently of other integrated circuits and components on the circuit board, said temperature control apparatus comprising:

a conductive block having a surface shaped to engage at least a portion of the accessible planar surface of one integrated circuit to be controlled and formed with a plurality of passageways therethrough, means for affixing said conductive block to the selected integrated circuit with said surface abutting the integrated circuit accessible planar surface, temperature sensing means disposed in a sensor passageway of said conductive block for monitoring the temperature of said conductive block, fluid delivery means for circulating a fluid through another of said passageways as a fluid passageway, and fluid temperature control means connected to said temperature sensing means and said fluid delivery means for adjusting the temperature of the fluid circulating through said fluid passageway thereby to control the temperature of said conductive block and the attached integrated circuit independently of the temperature of the other integrated circuits and other components on the circuit board.

2. Apparatus as recited in claim 1 wherein said affixing means comprises a vacuum passageway that at one end exits the integrated circuit housing at said abutting surface and vacuum pump means connected to the other end of said vacuum passageway for drawing a vacuum in said vacuum passageway thereby to affix said conductive block to the integrated circuit.

3. Apparatus as recited in claim 2 additionally comprising sealing means in said abutting surface proximate said vacuum passageway exit for sealing said conductive block to the integrated circuit housing when said vacuum pump means operates.

4. Apparatus as recited in claim 2 additionally comprising controller means for controlling the operation of said apparatus, said controller means including means connected to said vacuum means and said fluid delivery means for enabling the operation of said fluid delivery means when said vacuum pump means establishes a minimum vacuum between said conductive block and the integrated circuit housing.

5. Apparatus as recited in claim 4 additionally comprising condensation detection means for monitoring the formation of condensation on the integrated circuit.

6. Apparatus as recited in claim 4 wherein said fluid delivery means includes closed loop pumping means including said fluid passageway for circulating liquid through said conductive block and temperature control means for controlling the temperature of the liquid.

7. Apparatus as recited in claim 6 wherein said temperature control means includes fluid heating means for heating the fluid and fluid chilling means for cooling the fluid, said fluid heating and chilling means being disposed in said closed loop in seriatim and said fluid temperature control means controlling said fluid heating means and chilling means thereby to establish the fluid temperature in said fluid passageway.

8. Apparatus as recited in claim 7 additionally comprising means for monitoring the formation of condensation on said conductive block and means in said controller means for annunciating the formation of a predetermine condensation level.

9. Apparatus as recited in claim 1 additionally comprising means for monitoring the formation of condensation on said conductive block.

10. Apparatus as recited in claim 9 additionally comprising means for annunciating the formation of an undesirable level of condensation.

11. In apparatus for testing the operation of an electronic circuit board having a plurality of electrically interconnected, physically spaced, integrated circuits with housings and other components mounted thereon, each housing having at least one accessible planar surface having a predetermined shape, the improvement of temperature control apparatus for varying the temperature of an individual integrated circuit independently of other integrated circuits and components on the circuit board, said temperature control apparatus comprising:

conductive block having a first surface shaped to engage at least a portion of the accessible planar surface of an integrated circuit to be controlled and formed with a first passageway therethrough with a first end terminating at said first surface, sealing means at the first end of said first passageway for contacting the integrated circuit housing, and a second passageway formed therethrough spaced from said first passageway;

vacuum means attached to said first passageway for generating a vacuum therein whereby said first surface of said conductive block is affixed to the integrated circuit housing, closed loop circulation means connected to the second passageway for circulating a fluid through said conductive block, temperature control means including temperature sensing means disposed in another passageway of said conductive block for monitoring the temperature of said conductive block and temperature establishment means for establishing the temperature of the fluid circulated through said second passageway, and means for monitoring the formation of condensation on said conductive block whereby said temperature control apparatus can control the temperature of an attached integrated circuit independently of the temperature of the other integrated circuits and other components on the circuit board without the formation of undue condensation on either of said conductive block or integrated circuit.

12. Apparatus as recited in claim 11 wherein said temperature sensing means and said condensation monitoring means are disposed in recesses that are spaced from each other and said first ad second passageways.

13. Apparatus as recited in claim 11 wherein said second passageway is parallel to and spaced from said first conductive block surface.

14. Apparatus as recited in claim 13 wherein said closed loop circulation means comprises pump means for circulating said fluid and said temperature establishment means includes fluid heating means for heating the fluid and fluid chilling means for cooling the fluid, said fluid heating and chilling means being disposed in said closed loop in seriatim and said fluid temperature control means controlling said fluid heating means and chilling means thereby to establish the fluid temperature in said fluid passageway.

15. Apparatus as recited in claim 13 wherein said vacuum means includes vacuum pump means connected to said first passageway and means for controlling the operation of said vacuum pump means.

16. Apparatus as recited in claim 15 additionally comprising vacuum gage means for measuring the vacuum in said first passageway and input means for displaying the measured vacuum.

17. Apparatus as recited in claim 15 wherein said temperature control means includes fluid heating means for heating the fluid and fluid chilling means for cooling the fluid, said fluid heating and chilling means being disposed in said closed loop in seriatim and said fluid temperature control means controlling said heating means and chilling means thereby to establish the fluid temperature in said fluid passageway.

18. Apparatus as recited in claim 15 additionally comprising means for annunciating the formation of an undesirable level of condensation.

* * * * *